United States Patent [19]

Menegoli

[11] Patent Number: 5,252,926
[45] Date of Patent: Oct. 12, 1993

[54] APPARATUS AND METHOD FOR DISTINGUISHING BETWEEN FAULTS DUE TO ALTERNATOR FAILURE AND INTERRUPTION OF STATOR PHASE SIGNALS IN AUTOMOTIVE BATTERY CHARGING SYSTEMS

[75] Inventor: Paolo Menegoli, Phoenix, Ariz.

[73] Assignee: SGS-Thomson Microelectronics, Inc., Carrollton, Tex.

[21] Appl. No.: 876,878

[22] Filed: Apr. 30, 1992

[51] Int. Cl.$^5$ .................. G01R 31/00; H02P 9/00
[52] U.S. Cl. ....................... 324/545; 324/158 MG; 324/511; 324/546; 322/99
[58] Field of Search ............ 324/158 MG, 510, 511, 324/545, 546, 537; 322/99

[56] References Cited

U.S. PATENT DOCUMENTS

| | | | |
|---|---|---|---|
| 4,019,120 | 4/1977 | Fattic | 324/158 MG |
| 4,379,990 | 4/1983 | Sievers et al. | 322/99 |
| 4,755,737 | 7/1988 | Komurasaki et al. | 322/99 |
| 5,079,496 | 1/1992 | Pierret et al. | 322/99 X |

*Primary Examiner*—Gerard R. Strecker
*Assistant Examiner*—Diep Do
*Attorney, Agent, or Firm*—Richard A. Bachand; Lisa K. Jorgenson; Richard K. Robinson

[57] ABSTRACT

An automotive charging circuit fault detection circuit includes a pseudo stator-phase signal generator and a stator-phase existence circuit for determining if a stator-phase signal is below a predetermined threshold. A pseudo stator-phase signal control circuit selectively applies the pseudo stator-phase signal to replace the stator-phase signal when the stator-phase existence circuit determines that the stator-phase signal is below the predetermined threshold. A voltage detector circuit continues the application of the pseudo stator-phase signal if an output voltage from the charging circuit is above a minimum voltage. A timer times a predetermined time the stator-phase signal is below the predetermined threshold to enable the voltage detection circuit, and a warning indicator provides a warning if the pseudo stator-phase signal is applied and if an output voltage from the charging circuit is below the minimum voltage.

20 Claims, 3 Drawing Sheets

APPARATUS AND METHOD FOR DISTINGUISHING BETWEEN FAULTS DUE TO ALTERNATOR FAILURE AND INTERRUPTION OF STATOR PHASE SIGNALS IN AUTOMOTIVE BATTERY CHARGING SYSTEMS

BACKGROUND OF THE INVENTION

1. Field of the Invention

This invention relates to improvements in methods and circuits for detecting and distinguishing problems in the operation of an automotive alternator, and more particularly to distinguishing between a broken stator phase signal wire and a broken alternator belt.

2. Technical Background

In modern cars and trucks, the battery charging systems typically include a three phase synchronous alternator to produce an ac output voltage. A bridge circuit rectifies the ac voltage, and a voltage regulator maintains the voltage at a desired level.

The two basic parts of the alternator are the rotor and the stator. The rotor has a dc-excited winding, called the "field coil," to set up a rotating magnetic field. The stator has a three-phase winding that generates an ac emf to provide an output voltage. A belt connected to the engine turns the rotor, and the magnetic flux moving across the stator coils produces the ac emf on the stator. The amount of current generated is proportional to the speed of the rotor and the average current in the field coils. Typically a full-bridge rectifier having six diodes rectifies the generated ac voltage to charge the battery and supply energy for electrical loads.

The regulator is a circuit designed to provide a constant system output voltage to charge properly the battery to avoid damaging it. The system also provides a stable power supply to electrical loads. The regulator compensates for variations in the system loading, including battery charge levels, and for variations in rotor speed produced by changes in engine speed. The regulator performs this compensation by altering the average current through the rotor field coils and changing the dc level of the output voltage on the stator coils.

Until recently, the regulator consisted of several discrete electronic components. Then, with the arrival of integrated circuit technology, the automotive industry created a regulator that included a power transistor, some filtering capacitors, and a basic control circuit integrated onto a single integrated circuit device. In addition, the devices began to exhibit more sophisticated means for voltage regulation, fault-detection, and self protection on one integrated circuit device.

A frequent problem that may occur is the breakage of the belt that drives the alternator rotor, so that the battery is no longer charged. It is important to detect rapidly this kind of breakdown to avoid continuously supplying current to the field coils in the rotor and needlessly running down the battery. That is why in integrated regulators there is typically a "phase sequence" signal derived from a stator winding. This signal can be used also to detect whether the alternator is charging normally. When this sequence is lacking, it means that, for some reason, the alternator is not functioning normally.

Still, sometimes the wire that transmits the phase sequence information from the alternator to the regulator chip breaks. Since the regulator cannot distinguish between the alternator belt breaking and the phase sequence wire opening, the regulator stops the flow of current to the winding in the rotor and the charging system from charging the battery. Thus, this occurs though the system itself has not really undergone any breakdown. At first, a broken phase sequence wire was considered of little importance, because it occurs infrequently compared to a broken alternator belt. Thus, systems were designed to stop the flow of current to the rotor field coils every time the phase sequence was missing.

Now, it is desirable to distinguish between the case of the broken alternator belt and a broken phase sequence wire. A broken alternator belt justifies a system shutdown, but a broken phase sequence wire does not. Thus, the system can run more intelligently.

What is needed is a method and apparatus for making such a distinction.

SUMMARY OF THE INVENTION

Considering the above, it is, therefore, an object of the invention to provide an improved automotive battery charging system.

It is another object of the invention to provide an improved fault detection circuit for use with an automotive battery charging system.

It is another object of the invention to provide an improved method and circuit for distinguishing between a broken stator phase signal wire and a broken alternator belt in an automotive charging system.

It is another object of the invention to provide an improved automotive charging system circuit that can be integrated into a single integrated circuit device.

It is another object of the invention to provide a circuit of the type described that can be employed with signals presently available from typical automotive alternator systems.

One advantage of the method and circuit of the invention is that in circumstances in which a broken wire from the alternator that would ordinarily cause the charging system to stop charging the battery, the charging system is not disabled. The charging system is properly disabled, however, if the alternator belt should break or the rotor of the alternator should cease its rotation.

These and other objects, features, and advantages will become apparent to those skilled in the art from the following detailed description when read with the accompanying drawings and appended claims.

According to a broad aspect of the invention, an automotive charging circuit fault detection circuit is presented. The fault detection circuit includes a pseudo stator-status signal generator and a stator-status existence circuit for determining if a stator-status signal is above a predetermined threshold. A pseudo stator-status signal control circuit selectively applies the pseudo stator-status signal to replace the stator-status signal when the existence stator-status existence circuit determines that the stator-status signal is below the predetermined threshold. A voltage detector circuit continues the application of the pseudo stator-status signal if an output voltage from the charging circuit remains below the predetermined threshold.

A timer times a predetermined time during which the stator-status signal remains below the predetermined threshold for enabling the voltage detector circuit, and a warning indicator provides a warning if the pseudo stator-status signal is applied and if an output voltage from the charging circuit does not exist, or is below a minimum voltage.

In another broad aspect of the invention, a method is presented for distinguishing a fault in an automotive battery charging system of the type having an alternator, a rectifier circuit that receives an output of the alternator and provides a rectified alternator voltage and a stator-status signal, and a voltage regulator having a function enabled by the stator-status signal, the voltage regulator receiving the rectified alternator voltage and controlling the excitation to field windings of the alternator. The method includes generating a pseudo stator-status signal, and determining when the stator-status signal falls below a predetermined threshold. Additionally, the pseudo stator-status signal is applied to time voltage regulator when the stator-status signal is determined to be below the predetermined threshold. The application of the pseudo stator-status signal to the voltage regulator is continued if the output voltage from the voltage regulator exists, or is above a predetermined minimum voltage, and stopped if the output voltage from the voltage regulator does not exist, or falls below the predetermined minimum voltage.

BRIEF DESCRIPTION OF THE DRAWINGS

The invention is illustrated in the accompanying drawings in which.

In the various figures of the drawing, like reference numerals denote like parts.

DETAILED DESCRIPTION OF THE PREFERRED EMBODIMENTS

Figure 1:
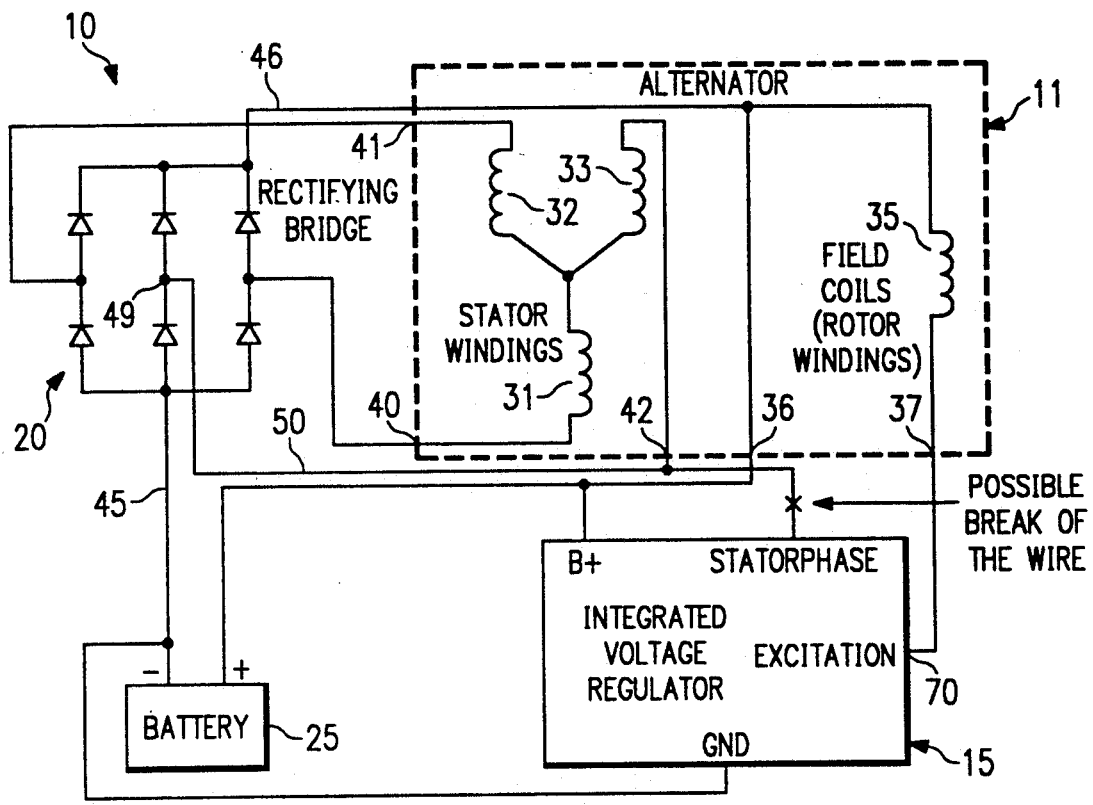
FIG. 1 is a schematic and box diagram of a typical automotive electrical system with which the circuitry and method of the invention can be used.

It should be noted that the term "automotive" is used throughout this application; however, the invention may find widespread use in vehicles of the type that have battery charging systems having an alternator having a stator and a rotor, a rectifier circuit that receives an output of the alternator and provides a rectified alternator voltage and a stator-status signal, and a voltage regulator connected to receive the rectified alternator voltage and to control the excitation to field windings of said alternator and connected to have a function that is enabled by said stator-status signal, and in which it is important to distinguish between a fault due to non-rotation of the rotor and a fault due to an interruption of the stator-status signal wire. A typical automotive electrical system 10 with which the fault detection circuitry of the invention can be incorporated is shown in FIG. 1. The electrical system 10 includes an alternator 11, a voltage regulator circuit 15, a rectifying bridge circuit 20, and a battery 25, all as known in the art.

The alternator 11 is a 3-phase synchronous device having three groups of stator windings 31, 32, and 33. A number of rotor windings, called "field coils," are connected to input nodes 36 and 37 by brushes (not shown). The number of field coils depends upon the number of poles of the alternator 11. It should be noted that although a plurality of field coils are found in typical automobile alternators, only one is illustrated in the drawing for simplicity.

The rotor on which the field coils are carried is mechanically driven by a belt connected to the engine of the vehicle with which the charging system 10 is associated. The magnetic flux variations, which are due to the excitation current in the field coils 35 and to the rotation of the rotor, generate current in the stator windings 31, 32, and 33. The stator windings 31, 32, and 33 therefore produce a voltage output on the output nodes 40, 41, and 42.

The rectifying bridge circuit 20 is generally mounted inside the alternator case, and converts the sinusoidal voltage appearing at the output nodes 40, 41, and 42 into a dc voltage on lines 45 and 46. The dc voltage appearing on lines 45 and 46 may be used to supply current to charge the battery 25 and to the electrical loads of the vehicle (not shown). The diodes of the rectifying bridge circuit 20 are connected in a full bridge pattern, as shown.

The regulator circuit 15 is designed to provide a somewhat constant output voltage to assure a good power supply for the electrical devices in the vehicle and to assure that the charging system does not damage the battery 25. The voltage regulator circuit 15 receives the output voltage from the rectifying bridge circuit 20 on lines 45 and 46. It additionally provides an excitation voltage to the field coil 35 on input line 37.

Presently, integrated voltage regulators typically receive a signal, commonly called as a "stator-phase signal," from a node 49 at which two of the diodes of the rectifying bridge 20 are interconnected. The stator-phase signal generally has several uses in the automobile in which the charging system is used. One use for the stator-phase signal is to provide a fault indication showing lack of or low voltage from the alternator 11 by indicating to the voltage regulator circuit 15 that the voltage in the rectifying bridge is below a predetermined minimum voltage or threshold. The stator-phase signal has a form of spaced pulses, since it is derived from one node 49 of the bridge diode interconnections. When the stator-phase signal is above the predetermined threshold, it is assumed that the alternator 11 is working, and more specifically the rotor of the alternator 11 is rotating properly. Thus, if the rotation of the rotor is interrupted, for example, by the belt connecting it to the engine breaking, the stator-phase signal also will be interrupted. This condition is properly interpreted as a fault, and the charging and field coil excitation functions of the circuit are discontinued.

However, as described above, it is possible for the continuity of the wire 50 on which the stator phase signal is carried to be broken, for example, at the (X) shown in the drawing, or at another location. Such a break in continuity of the wire 50 would be erroneously interpreted as a failure of the alternator 11 to produce an output voltage due to the non-rotation of the field coil 35. Thus, the integrated voltage regulator circuit 15 would cause the battery 25 to no longer be charged.

Figure 2:
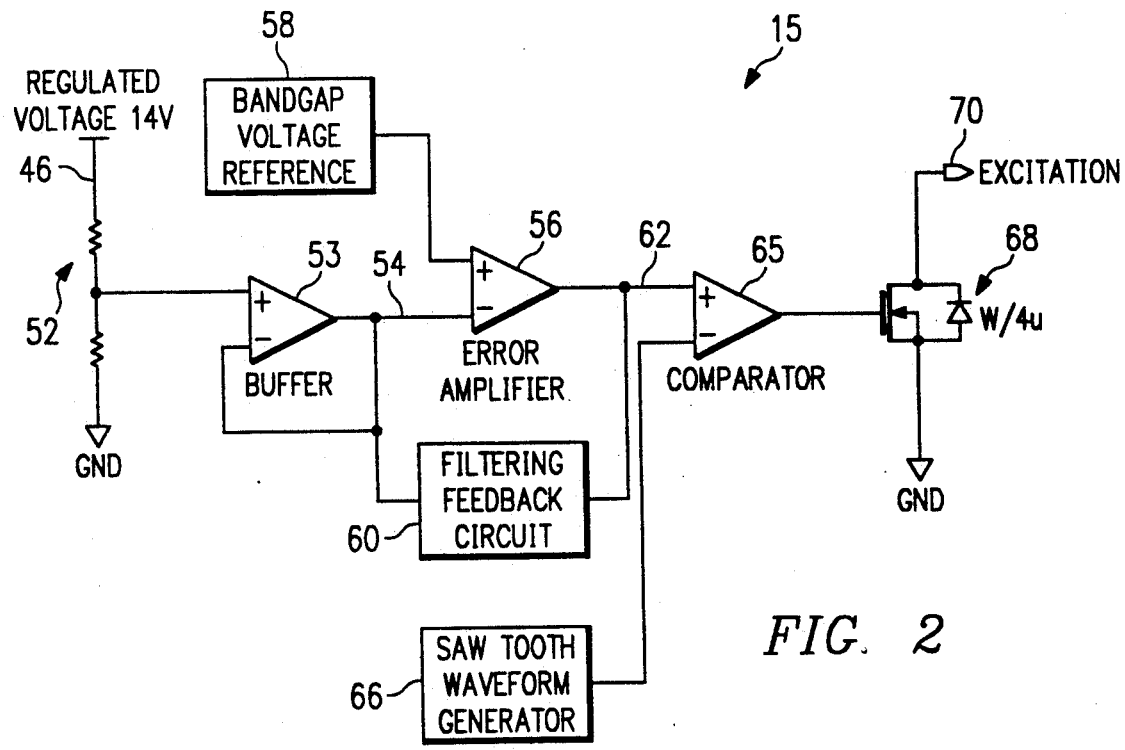
FIG. 2 is an electrical schematic diagram illustrating a voltage regulator.

The general operation of a conventional voltage regulator circuit 15 is now described with reference to FIG. 2. The integrated voltage regulator circuit 15 senses the output voltage from the rectifying bridge 20 on the line 46, for example, using a resistor voltage divider network 52. The output from the voltage divider network 52 is connected to the non-inverting input of a buffer amplifier 53. The buffer amplifier 53 can be a unity gain buffer, to provide a low output impedance. The buffer amplifier 53 provides an error signal on its output line 54 to the inverting input of an error amplifier 56. A band gap voltage reference 58 is connected to the non-inverting input of the error amplifier 56. Also, a feedback filter circuit 60 is connected between the output of the error amplifier 56 and the inverting input. The error amplifier 56 serves as a filter to guarantee stability of the loop. The band gap voltage reference 58 provides a precise voltage output, and is typically temperature compensated, for precise operation of the error amplifier 56.

The output from the error amplifier 56 on line 62 is connected to the non-inverting input of a comparator 65. The output from a saw-tooth waveform generator 66 is connected to the inverting input of the comparator 65. Thus, the output signal from the error amplifier 56 on line 62 is compared with the saw-tooth waveform generated by a saw-tooth waveform generator 66. This provides a pulse width modulation (PWM) mode signal to drive the power stage 68 to provide output voltage on the excitation node 70 for application to the field coils 35 (see FIG. 1). The duty cycle of the driving signal is modulated to provide an average current in the field coil 35. Therefore, a regulated voltage is produced at the output of the alternator 11 on nodes 40, 41, and 42.

Figure 3:
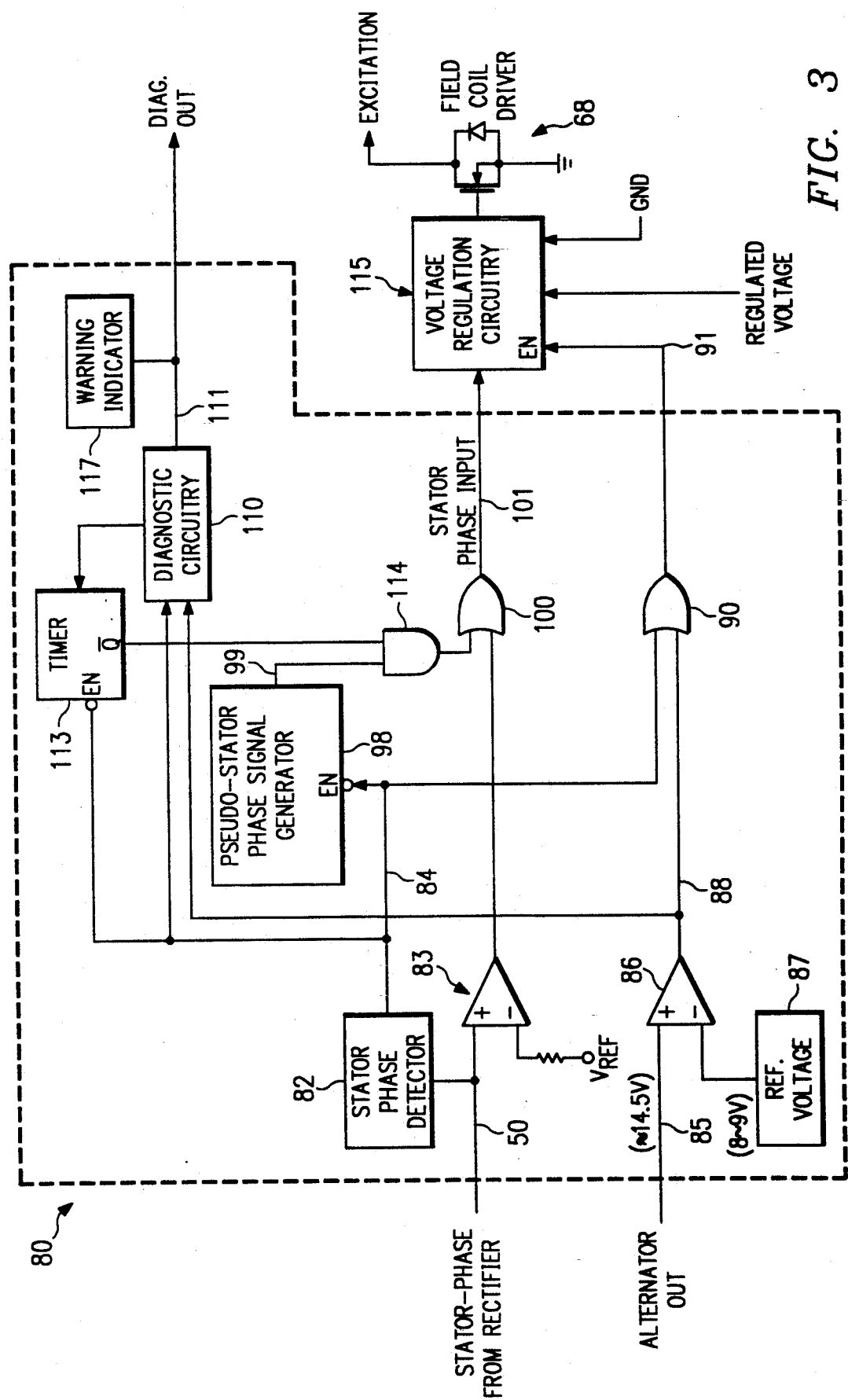
FIG. 3 is an electrical schematic diagram of a circuit for use with the charging circuitry of FIG. 1 and voltage regulator circuitry of FIG. 2, according to the invention, to detect charging circuit faults, in general, and to distinguish between a broken or open stator status signal wire and a non-rotating rotor of the alternator, in particular, according to the invention.
Figure 4:
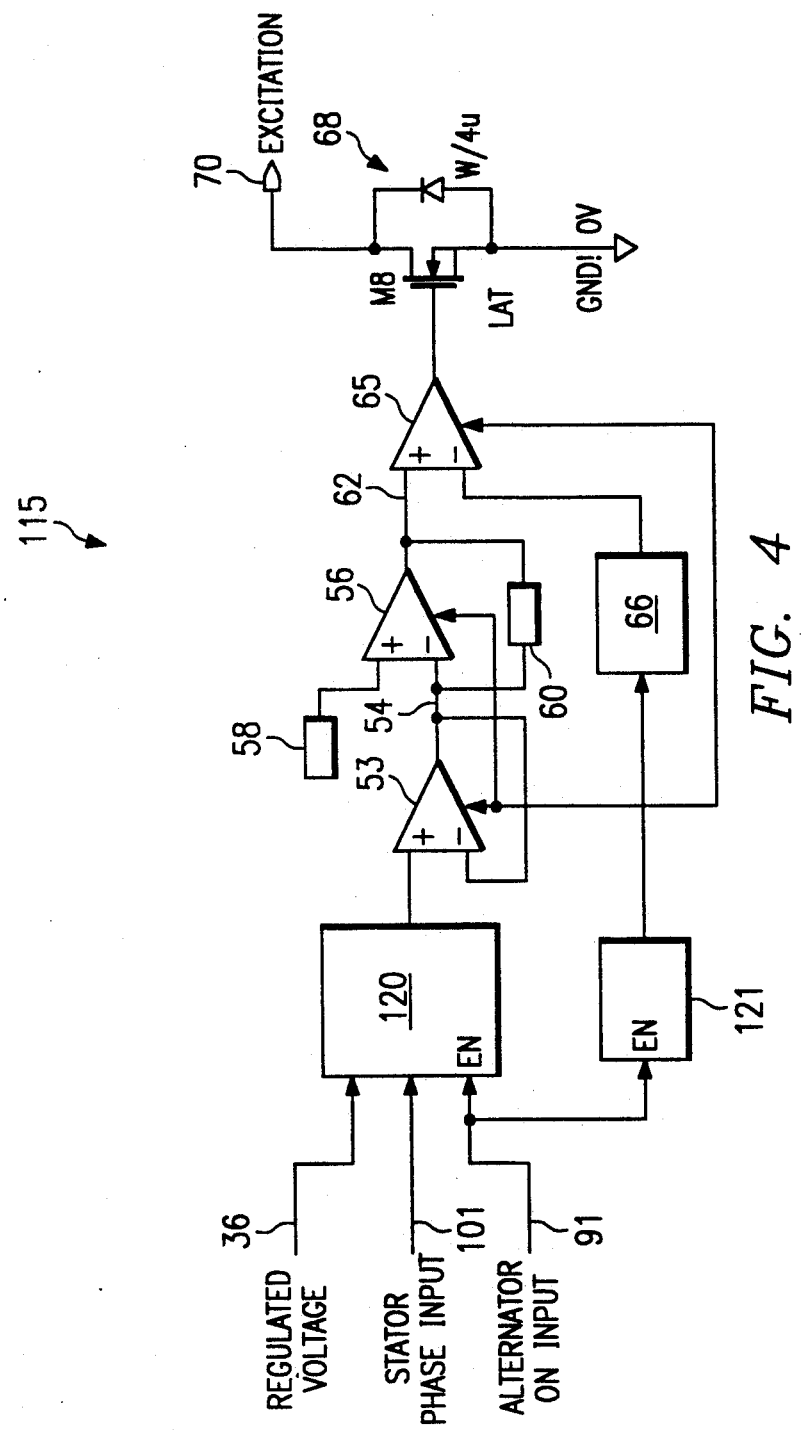
FIG. 4 is an electrical schematic diagram illustrating a voltage regulator that utilizes the stator-phase signal and can be attached to the fault detection circuitry of the invention.

A voltage regulation circuitry 115 which uses the stator phase signal is shown in FIG. 4. Instead of a voltage divider network 52, a sample and hold circuit 120 is used. The sample and hold circuit 120 is enabled by a logic high based on the output from the OR-gate 90 in FIG. 3. The output from the OR-gate 100 in FIG. 3 is connected, by a signal line 101, to the sample and hold circuit 120 and triggers the sampling of the rectified voltage when the stator-phase signal (or the pseudo stator-phase signal) is at a particular state, i.e. a rising edge or falling edge of the signal. A bias generator 121 is also enabled by a logic high from the OR-gate 90 in FIG. 3 and controls the voltage delivered to power the operational amplifiers 53, 56, 65 and saw tooth waveform generator 66. The output from the sample and hold circuit 120 is connected to the non-inverting input of buffer amplifier 53. The rest of the voltage regulation circuitry 115 operates the same way as the circuit shown in FIG. 2.

To distinguish the condition described above of a break in continuity of the "stator phase" signal carrying line 50 and non-rotation of the rotor of the alternator 11, the circuit of FIG. 3 is provided within the integrated voltage regulator 15 shown in FIG. 1.

The fault distinguishing circuit of the invention 80 is illustrated in FIG. 3, and can be used in the electrical charging circuit of FIG. 1. The circuit of FIG. 3 receives the stator phase signal on a line 50 from the rectifier 20, and applies the signal to a stator phase signal detector 82 and a waveshaping comparator circuit 83. The waveshaping comparator circuit 83 compares the stator phase signal, which is in the form of a rectified wave, to a reference voltage to form a square wave output. The stator phase signal detector 82 provides an output on a line 84 that indicates the presence or absence of a stator phase signal on the line 50.

Additionally, a voltage that can be derived from the system voltage of the automobile is applied to a node 85 and applied to the non-inverting input of a comparator 86. The voltage applied to node 85 can be derived, for example, from the battery, the output from the alternator on the line 46, from a point within the voltage regulator, such as line 54 shown in FIG. 2, or other location that presents the voltage as produced by the charging system 10. A voltage from a voltage reference 87 is applied to the inverting input of the comparator 86. The voltage of the voltage reference 87 can be, for example, eight or nine volts for comparison to the typical circuit output voltage of 14.5 applied to node 85. This voltage reference 87 may bederived from band gap voltage reference 58 which is shown in FIG. 2. Thus, the output on line 88 from comparator 86 will be high so long as the voltage applied to the node 85 exceeds the voltage of the reference voltage source 87.

The output from the comparator 86 on the line 88 is applied to one input of an OR gate 90. On the other hand, the signal from the stator phase signal detector 82 is conducted on line 84 to the other input of the OR gate 90. The output from the OR gate 90 is applied via a line 91 to an enable input terminal of the voltage regulation circuitry 115. The output from the voltage regulation circuitry 115 is derived at the excitation output and applied to the field coil driver circuitry 68 for application to the field coils 35 (see FIG. 1) of the alternator 10.

In addition, the fault detection circuit 80 includes a pseudo-stator phase signal generator 98. The pseudo-stator phase signal generator is a square wave generator that produces an output on the line 99 at a fixed frequency for application to the voltage regulation circuitry 115 via an OR gate 100. The pseudo-stator phase signal generator 98 is enabled by the absence of the stator phase signal on line 50, detected by the stator phase detector 82 as indicated by the signal on the line 84.

Thus, in the absence of a stator phase signal on line 50, the pseudo-stator phase signal generator circuit 98 is enabled and the OR gate 100 passes the output therefrom on signal line 101 to the voltage regulation circuitry 115 in place of the stator phase signal from the rectifier circuit 20.

Furthermore, in the event that the voltage from the system voltage source on the node 85 falls below the reference voltage provided by the voltage reference circuit 87, the stator phase signal from the rectifier will also decrease. This results in no enable signal being delivered to the voltage regulation circuitry 115 by the OR gate 90, and the system being shut down. Thus, it can be seen that in the event of a broken belt, stuck or frozen rotor, or other similar cause in which the voltage is not actually produced, the voltage regulation circuitry 115 is disabled, and shut down, disabling the excitation to the field coils 35, and discontinuing the charge current to the battery 25. On the other hand, if only the externally applied stator phase signal on line 50 ceases to exceed the predetermined threshold, for example, due to a broken wire or other cause, the pseudo-stator phase signal generator 98 is enabled to apply a stator phase signal to the voltage regulation circuitry 115 in place of the stator phase signal from the rectifier, allowing the system to continue normal operation.

If desired, a diagnostic circuitry 110 may be provided to receive the output from the comparator 86 as well as the output from the stator phase detector 82. The diagnostic circuitry 110 operates to provide a diagnostic output signal on a line 111, for example, to a bulb (not shown) or other failure indicating device 117 the cabin of the vehicle in the event that the regulator voltage on node 85 is interrupted and, for example, the pseudo-stator phase signal generator is enabled. Other warning indications, of course, can be developed from other signal combinations within the circuit 80.

Finally, if desired, a timer 113 optionally can be provided. The timer 113 is also enabled by the failure of the stator phase signal detector circuit 82 to detect a stator phase signal on the line 50. The timer circuit 113 then can be connected, if desired, to measure a pre-determined time within which the voltage or lack thereof on node 85 is to be detected. In the event that the voltage on node 85 is not detected within the predetermined time established by the timer 113, the output from the pseudo-stator phase signal detector on line 99 is disabled, for example by an AND gate 114, thereby disabling the excitation output to the field coils 35 of the alternator 11.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A circuit for detecting faults in a vehicular charging circuit, comprising:
    a pseudo stator-phase signal generator receiving a stator-phase signal from the vehicular charging circuit for detecting an absence of the stator-phase signal and providing a pseudo stator-phase signal in response to the detected absence of the stator-phase signal;
    a stator-phase existence circuit receiving the stator-phase signal from the vehicular charging circuit for determining if the stator-phase signal is above a predetermined threshold;
    a pseudo stator-phase signal control circuit connected to outputs of said pseudo stator-phase signal generator and said stator-phase existence circuit for selectively replacing said stator-phase signal with said pseudo stator-phase signal when said stator-phase existence circuit determines that said stator-phase signal is below the predetermined threshold; and
    a voltage detector circuit for continuing the application of the output from said pseudo stator-phase signal control circuit to a voltage regulator if a charging voltage from the vehicular charging circuit is above a predetermined minimum value.

2. The circuit of claim 1, further comprising a warning indicator for providing a warning if said pseudo stator-phase signal is applied and if the charging voltage from said vehicular charging circuit is below the predetermined minimum value.

3. The circuit of claim 1, further comprising a timer for timing a predetermined time period that the stator-phase signal is below the predetermined threshold for enabling said voltage detector circuit.

4. The circuit of claim 1, further comprising a charging circuit fault detector for detecting when both the stator-phase signal is below the predetermined threshold and the charging voltage is below the predetermined minimum voltage.

5. A fault detecting circuit for distinguishing a fault in a vehicular battery charging system having an alternator, a rectifier circuit connected to an output of the alternator and providing as outputs a rectified alternator voltage and a stator-phase signal, and a voltage regulator receiving the rectified alternator voltage and controlling an excitation signal to field windings of said alternator, said voltage regulator being enabled by said stator-phase signal, said fault detecting circuit comprising:
    a first circuit connected to the stator-phase signal output of the rectifier circuit for detecting the absence of the stator-phase signal and providing as an output a pseudo stator-phase signal in response to the detected absence of the stator-phase signal;
    a second circuit connected to the stator-phase signal output of the rectifier circuit for determining when the stator-phase signal is below a predetermined threshold;
    a third circuit connected to the output of said first circuit and an output of said second circuit for selectively applying said pseudo stator-phase signal to said voltage regulator when said second circuit determines that the stator-phase signal is below the predetermined threshold; and
    a fourth circuit connected to the vehicular battery charging system to receive a charging voltage and for continuing the application of an output of said third circuit to said voltage regulator if the charging voltage is above a minimum voltage, and for discontinuing the application of the output of said third circuit to said voltage regulator if the charging voltage is below the minimum voltage.

6. The circuit of claim 5, further comprising a warning indicator connected to said fourth circuit to provide a warning if the charging voltage is below the minimum voltage.

7. The circuit of claim 5, further comprising a timer for timing a predetermined time period when the first circuit detects the absence of the stator-phase signal, and wherein said third circuit selectively applies said pseudo stator-phase signal to said voltage regulator after said first circuit detects the absence of the stator-phase signal only during the predetermined time period.

8. The circuit of claim 5, further comprising a wire for delivering the stator-phase signal from said rectifier circuit to said fault detecting circuit, wherein a discontinuity in said wire that produces an interruption of said stator-phase signal is distinguished from a failure in said alternator.

9. A vehicular battery charging system having an alternator containing a stator and a rotor, a rectifier circuit connected to an output of the alternator and providing a rectifier alternator voltage and a stator-phase signal, and a voltage regulator receiving the rectified alternator voltage and controlling an excitation signal to field windings of said alternator, said voltage regulator being enabled by said stator-phase signal, said vehicular battery charging system further comprising a fault detecting circuit for distinguishing between a fault due to non-rotation of the rotor and a fault due to an interruption of the stator-phase signal, the fault detecting circuit comprising:
    a first circuit connected to the stator-phase signal output of said rectifier circuit for detecting an absence of the stator-phase signal and providing a pseudo stator-phase signal in response to the detected absence of the stator-phase signal;

a second circuit connected to the stator-phase signal output of said rectifier circuit for determining when the stator-phase signal is below a predetermined threshold;

a timer enabled by the first circuit for timing a predetermined time period after the first circuit determines the absence of the stator-phase signal;

a third circuit connected to outputs of said first circuit and said second circuit, said third circuit is controlled by said timer for applying said pseudo stator-phase signal to said voltage regulator during said predetermined time period after said first circuit detects the absence of the stator-phase signal; and a fourth circuit connected to the vehicular battery charging system to receive a charging voltage and for continuing the application of an output of the third circuit to said voltage regulator if the charging voltage is above a minimum voltage during said predetermined time period, and for discontinuing the application of the output of said third circuit to said voltage regulator if the charging voltage is below the minimum voltage during said predetermined time period.

10. The circuit of claim 9, further comprising a warning indicator, which is connected to said fourth circuit, for providing a warning if the voltage from said voltage regulator is below the minimum voltage.

11. The circuit of claim 9, further comprising a wire for delivering the stator-phase signal from said rectifier circuit to said voltage regulator wherein a discontinuity in said wire, which produces an interruption of said stator-phase signal, is distinguished from said non-rotation of said rotor.

12. A vehicular battery charging system which produces a charging voltage, comprising:

an alternator having a stator and a rotor and producing alternator voltages;

a rectifier circuit connected to an output of the alternator and providing a rectified alternator voltage from the alternator voltages and a stator-phase signal;

a voltage regulator connected to receive the rectifier alternator voltage and controlling the excitation to field windings of said alternator, said voltage regulator being enabled by said stator-phase signal;

a pseudo stator-phase signal generator connected to receive the stator-phase signal, for detecting an absence of the stator-phase signal and producing a pseudo stator-phase signal in response to the detected absence of the stator-phase signal;

a stator-phase existence circuit connected to receive the stator-phase signal for determining if said stator-phase signal from said rectifier circuit is above a predetermined threshold;

a pseudo stator-phase signal control circuit connected to said pseudo stator-phase signal generator and said stator-phase existence circuit for selectively replacing said stator-phase signal with said pseudo stator-phase signal when said stator-phase existence circuit determines that said stator-phase signal is below the predetermined threshold; and a voltage detector circuit connected to said voltage regulator for continuing the application of an output of said pseudo stator-phase signal control circuit to said voltage regulator if said charging voltage is above a minimum voltage.

13. The vehicular battery charging system of claim 12, wherein the charging voltage is a voltage from said voltage regulator, and said voltage detector circuit is connected to receive the charging voltage from said voltage regulator for continuing the application of the pseudo stator-phase signal to said voltage regulator if the charging voltage from said voltage regulator is above the minimum voltage during said predetermined time period, and for discontinuing the application of the pseudo stator-phase signal to said voltage regulator if the charging voltage from said voltage regulator is below the minimum voltage during said predetermined time period.

14. The vehicular battery charging system of claim 12, further comprising a timer circuit for timing a predetermined time period after the detection of the absence of the stator-phase signal, said timer circuit connects said pseudo stator-phase signal to said voltage regulator during said predetermined time period after the detection of the absence of the stator-phase signal.

15. The vehicular battery charging system of claim 12, wherein said rectifier circuit comprises a six-diode bridge in which said alternator voltage from each phase of the alternator is applied to a respective diode interconnection node, and wherein one of said diode interconnection nodes provides said stator-phase signal.

16. The vehicular battery charging system of claim 15, further comprising a wire for delivering the stator-phase signal from said rectifier circuit to said voltage regulator wherein a discontinuity in said wire, which produces an interruption of said stator-phase signal, is distinguished from a failure in said alternator.

17. A method for distinguishing a fault in a vehicular battery charging system of the type having an alternator, a rectifier circuit connected to an output of the alternator and providing a rectified alternator voltage and a stator-phase signal, and a voltage regulator having a function that is enabled by said stator-phase signal, said voltage regulator receiving the rectified alternator voltage and controlling an excitation signal to field windings of said alternator, said method comprising:

determining if the stator-phase signal is below a predetermined threshold;

generating a pseudo stator-phase signal when the stator-phase signal is below the predetermined threshold;

applying said pseudo stator-phase signal to said voltage regulator when the stator-phase signal is determined to be below the predetermined threshold and applying the stator-phase signal to said voltage regulator when the stator-phase signal is determined to be above the predetermined threshold;

continuing the application of the pseudo stator-phase signal to said voltage regulator if the charging voltage from said vehicular battery charging system is above a minimum voltage, and discontinuing the application of the pseudo stator-phase signal to said voltage regulator if the charging voltage from said vehicular battery charging system is below the minimum voltage.

18. The method of claim 17, further comprising a warning indicator connected to said fourth circuit which provides a warning if the charging voltage is below the minimum voltage.

19. The method of claim 17, further comprising timing a predetermined time period when the stator-phase signal is below the predetermined threshold, and selectively applying said pseudo stator-phase signal to said voltage regulator after the determination that the stator-phase signal is below the predetermined threshold only during the predetermined time period.

20. The method of claim 17, further comprising a wire for delivering the stator-phase signal from said rectifier circuit to said voltage regulator wherein a discontinuity in said wire, which produces an interruption of said stator-phase signal, is distinguished from a failure in said alternator.

* * * * *